United States Patent
Kondo (10) Patent No.: US 7,924,899 B2
(45) Date of Patent: Apr. 12, 2011

(54) VERTICAL-CAVITY SURFACE-EMITTING LASER DIODE (VCSEL), METHOD FOR FABRICATING VCSEL, AND OPTICAL TRANSMISSION APPARATUS

(75) Inventor: Takashi Kondo, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 100 days.

(21) Appl. No.: 12/471,588

(22) Filed: May 26, 2009

(65) Prior Publication Data
US 2010/0111125 A1    May 6, 2010

(30) Foreign Application Priority Data
Nov. 5, 2008   (JP) ................................. 2008-284623

(51) Int. Cl.
*H01S 5/00* (2006.01)
(52) U.S. Cl. ........... 372/50.124; 372/45.01; 372/46.013; 372/50.11
(58) Field of Classification Search ............. 372/50.124
See application file for complete search history.

(56) References Cited

U.S. PATENT DOCUMENTS
| | | |
|---|---|---|
| 2005/0100068 A1 | 5/2005 | Jikutani |
| 2006/0227835 A1 | 10/2006 | Ueki et al. |
| 2008/0253422 A1 | 10/2008 | Onishi |

FOREIGN PATENT DOCUMENTS
| | | |
|---|---|---|
| JP | 10-125999 | 5/1998 |
| JP | 11-4040 | 1/1999 |
| JP | 2002-353562 | 12/2002 |
| JP | 2003-324251 | 11/2003 |
| JP | 2004-103754 | 4/2004 |
| JP | 2004-253408 | 9/2004 |
| JP | 2004-288902 | 10/2004 |
| JP | 2006-196830 | 7/2006 |
| JP | 2006-253484 | 9/2006 |
| JP | 2006-294811 | 10/2006 |
| JP | 2007-529910 | 10/2007 |
| JP | 2008-235574 | 10/2008 |

*Primary Examiner* — Minsun Harvey
*Assistant Examiner* — Xnning Niu
(74) *Attorney, Agent, or Firm* — Fildes & Outland, P.C.

(57) ABSTRACT

Provided is a VCSEL that includes a lower DBR of a first conductivity type, an active region, and an upper DBR of a second conductivity type, on a substrate. The lower DBR has a first to-be-oxidized Al-containing layer located farther from the active region than a second to-be-oxidized layer that is formed in the upper DBR. Both layers have an oxidized region and a first or a second non-oxidized region surrounded by the oxidized region. The first non-oxidized region is larger than the maximum size of the second non-oxidized region for a single mode oscillation, and smaller than the maximum size of the first non-oxidized region for a single mode oscillation. The second non-oxidized region is larger than the maximum size of the second non-oxidized region for a single mode oscillation. The first non-oxidized region has a size equal to or larger than that of the second non-oxidized region.

13 Claims, 6 Drawing Sheets

VERTICAL-CAVITY SURFACE-EMITTING LASER DIODE (VCSEL), METHOD FOR FABRICATING VCSEL, AND OPTICAL TRANSMISSION APPARATUS

CROSS-REFERENCE TO RELATED APPLICATION

This application is based on and claims priority under 35 USC 119 from Japanese Patent Application No. 2008-284623 filed on Nov. 5, 2008.

BACKGROUND

1. Technical Field

The present invention relates to a vertical-cavity surface-emitting laser diode (hereinafter referred to as VCSEL), a method for fabricating a VCSEL, and an optical transmission apparatus.

2. Related Art

In the fields of electronic storage apparatus or optical transmission, VCSELs have been used as light sources. A VCSEL may include, on a substrate, an upper and a lower semiconductor mirror layers sandwiching an active region; and emit a laser light beam perpendicularly with respect to the substrate. For a selective oxidation-type VCSEL, an oxidation controlled layer for performing current confining and light confining is formed in proximity to the active region to make the diameter of an oxidation aperture of the oxidation controlled layer smaller, thereby the VCSEL is operated in a single traverse mode. To obtain the single traverse mode, the diameter of the oxidation aperture should be as small as about three micrometers; therefore, for such a VCSEL, it has been desired to improve optical output and electrostatic discharge (ESD) resistance, and lower resistance value and heat dissipation, and extend lifetime, and increase productivity.

SUMMARY

An aspect of the present invention provides a VCSEL that includes: a first semiconductor multilayer film reflective mirror of a first conductivity type made of stacked high-Al refractive index layers having a high Al-composition and low-Al refractive index layers having a lower Al-composition than the high-Al refractive index layer, an active region including a light emitting layer, and a second semiconductor multilayer film reflective mirror of a second conductivity type made of stacked high-Al refractive index layers having a high Al-composition and low-Al refractive index layers having a lower Al-composition than the high-Al refractive index layer, on a substrate; a mesa structure formed from the second reflective mirror to at least a portion of the first reflective mirror; a first to-be-oxidized Al-containing layer formed in the first reflective mirror and having a higher Al-composition than the high-Al refractive index layer of the first reflective mirror; and a second to-be-oxidized Al-containing layer formed in the second reflective mirror or between the active region and the second reflective mirror and having a higher Al-composition than the high-Al refractive index layer of the second reflective mirror. The first to-be-oxidized Al-containing layer is formed farther from the active region than the second to-be-oxidized Al-containing layer. The first to-be-oxidized Al-containing layer has a first oxidized region oxidized from a side surface of the mesa or trench structure, and a first non-oxidized region surrounded by the first oxidized region. The second to-be-oxidized Al-containing layer has a second oxidized region oxidized from a side surface of the mesa or trench structure, and a second non-oxidized region surrounded by the second oxidized region. The size of the first non-oxidized region is larger than the maximum size of the second non-oxidized region that provides a single mode oscillation, and smaller than the maximum size of the first non-oxidized region that provides a single mode oscillation. The size of the second non-oxidized region is larger than the maximum size of the second non-oxidized region that provides a single mode oscillation. The size of the first non-oxidized region is equal to or larger than the size of the second non-oxidized region.

BRIEF DESCRIPTION OF THE DRAWINGS

Exemplary embodiments of the present invention will be described in detail based on the following figures, wherein.

DETAILED DESCRIPTION

Referring to the accompanying drawings, exemplary embodiments for implementing the present invention will be described in detail. These drawings are slightly exaggerated for purposes of clearly illustrating characteristics of the invention, and wherein various structures are not necessarily drawn to scale of an actual VCSEL.

Figure 1:
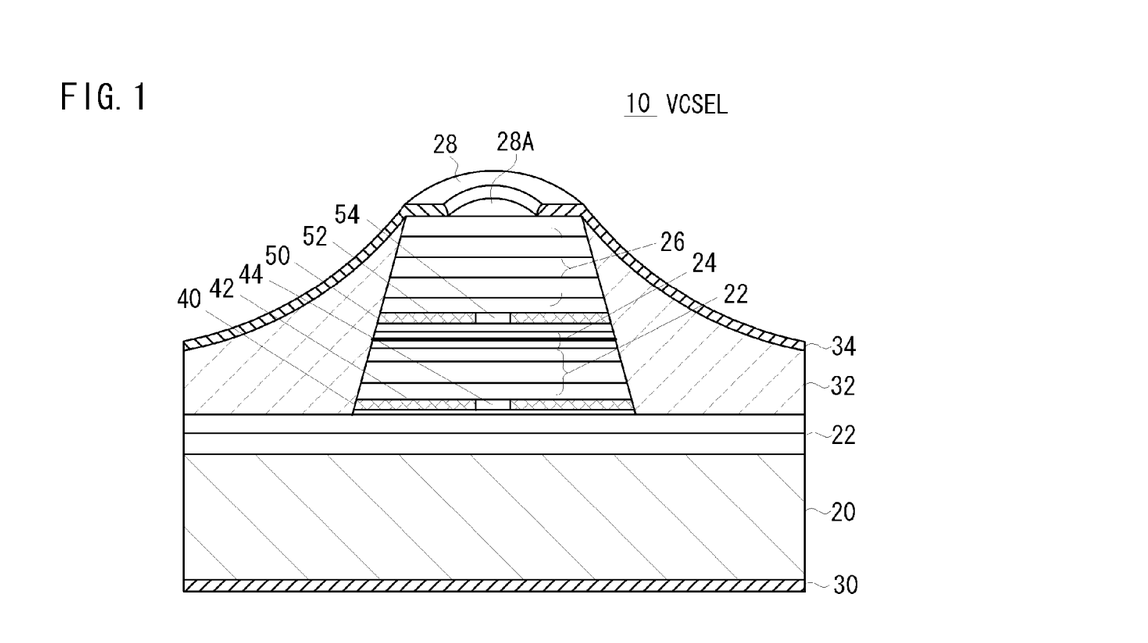
FIG. 1 is a schematic cross sectional view of a VCSEL according to a first example of the present invention.

FIG. 1 is a cross sectional view illustrating a schematic configuration of a VCSEL according to a first example of the present invention. A VCSEL 10 according to the first example may include an n-type GaAs substrate 20, an n-type lower Distributed Bragg Reflector (hereinafter referred to as DBR) 22 that forms a semiconductor multilayer film reflective mirror stacked on the substrate, an active region 24 that includes a light emitting layer, a p-type upper DBR 26 that forms a semiconductor multilayer film reflective mirror, an annular p-side electrode 28 formed on a top portion of the upper DBR 26, an n-side electrode 30 formed on the back surface of the substrate 20, an insulator 32 that covers a periphery of a mesa structure from the upper DBR 26 to a portion of the lower DBR 22, and a metal wiring 34 that extends on the insulator 32 and may be coupled to the p-side electrode 28. The metal wiring 34 may be coupled to an electrode pad (not shown), and a bonding wire or the like may be coupled to the electrode pad. By applying a forward biased driving current between the p-side electrode 28 and the n-side electrode 30, a single-mode laser light beam having a wavelength of 850 nm may be emitted from an opening 28A in the p-side electrode 28 perpendicularly with respect to the substrate.

The lower DBR 22 may be made by stacking plural pairs of an n-type AlGaAs layer having a high Al-composition and an n-type AlGaAs layer having a low Al-composition. For example, the lower DBR 22 may be made by alternately stacking 37.5 periods of $Al_{0.9}Ga_{0.1}As$ and $Al_{0.12}Ga_{0.88}As$ having a carrier concentration of $2 \times 10^{18}$ cm$^{-3}$ such that the film thickness of each layer becomes ¼ of the wavelength in the medium.

In the lower DBR 22, a first to-be-oxidized Al-containing layer 40 that performs a light confining function may be formed. The first to-be-oxidized Al-containing layer 40 may be formed of, for example, an n-type AlAs layer or AlGaAs layer, wherein the Al-composition thereof is higher than the Al-composition of the $Al_{0.9}Ga_{0.1}As$ layer of the lower DBR 22, and the film thickness thereof may be about 20 to 30 nm.

The active region 24 may be made of, for example, an undoped lower $Al_{0.6}Ga_{0.4}As$ spacer layer, an undoped quantum well active layer (made of three GaAs quantum well layers each having a thickness of 70 nm and four $Al_{0.3}Ga_{0.7}As$ barrier layers each having a thickness of 50 nm), and an undoped upper $Al_{0.6}Ga_{0.4}As$ spacer layer. The film thickness of the active region 24 is the wavelength in the medium.

The upper DBR 26 may be made by stacking plural pairs of a p-type AlGaAs layer having a high Al-composition and a p-type AlGaAs layer having a low Al-composition. The upper DBR 26 may be made by, for example, alternately stacking 26 periods of $Al_{0.9}Ga_{0.1}As$ and $Al_{0.12}Ga_{0.88}As$ having a carrier concentration of $2 \times 10^{18}$ cm$^{-3}$ such that the film thickness of each layer becomes ¼ of the wavelength in the medium, and a contact layer being the uppermost layer is a p-type GaAs layer having a carrier concentration of $1 \times 10^{19}$ cm$^{-3}$ and a film thickness of about 20 nm.

In the upper DBR 26, a second to-be-oxidized Al-containing layer 50 that performs a current confining function may be formed. The second to-be-oxidized Al-containing layer 50 may be made of, for example, a p-type AlAs layer or AlGaAs layer, wherein the Al-composition of the second to-be-oxidized Al-containing layer 50 is higher than the Al-composition of the $Al_{0.9}Ga_{0.1}As$ layer of the upper DBR 26, and the film thickness thereof may be about 20 to 30 nm.

By etching semiconductor layers from the upper DBR 26 to a portion of the lower DBR 22, a cylindrical or conical mesa structure, trench structure or post structure may be formed. In the mesa structure, at least the side surfaces of the first and second to-be-oxidized Al-containing layers 40 and 50 are exposed, and in an oxidation process, the first and second to-be-oxidized Al-containing layers 40 and 50 are oxidized from the side surfaces of the mesa to a certain distance. After the oxidation, the first to-be-oxidized Al-containing layer 40 has an annular oxidized region 42 oxidized from the side surface of the mesa, and a non-oxidized region 44 (that is, an oxidation aperture made of an n-type conductive region) surrounded by the oxidized region 42; and the second to-be-oxidized Al-containing layer 50 has an annular oxidized region 52 oxidized from the side surface of the mesa, and a non-oxidized region 54 (that is, an oxidation aperture made of a p-type conductive region) surrounded by the oxidized region 52, in the upper DBR 26. Each of the non-oxidized regions 44 and 54 in a plan view may be a round shape that reflects the outline of the mesa.

As obvious for those skilled in the art, when the composition and the film thickness of the first and second to-be-oxidized Al-containing layers 40 and 50 are same, the distances of the oxidation from the side surface of the mesa of the first and second to-be-oxidized Al-containing layers become same. Therefore, if the outer diameters of the first and second to-be-oxidized Al-containing layers in the mesa are same, the areas of the oxidized regions 42 and 52 in a plan view are equal, and the aperture diameters of the non-oxidized regions 44 and 54 are equal. When the mesa is formed in a conical shape, and the outer diameter of the first oxidized Al-containing layer 40 is larger than the outer diameter of the second to be oxidation Al-containing layer 50, the distances of the oxidation of the oxidized regions 42 and 52 are equal; however, the aperture diameter of the non-oxidized region 44 of the first oxidized Al-containing layer 40 becomes larger than the aperture diameter of the non-oxidized region 54 of the second oxidized Al-containing layer 50. In addition, if the film thickness and the composition of each of the first and second to-be-oxidized Al-containing layers are made different each other, the distance of the oxidation of the first and second to-be-oxidized Al-containing layers may be controlled individually under a same oxidation condition.

At a top portion of the mesa structure, that is, on an emission surface of the VCSEL, the p-side electrode 28 may be formed. In the p-side electrode 28, a circular opening 28A for emitting a laser light beam may be formed. The center of the opening 28A coincides with the center of the non-oxidized regions 44 and 54 of the first and second oxidized Al-containing layers, and the center of the regions coincides with the optical axis of the VCSEL. The size of the opening 28A is preferably larger than the aperture diameters of the non-oxidized regions 44 and 54.

Figure 2:
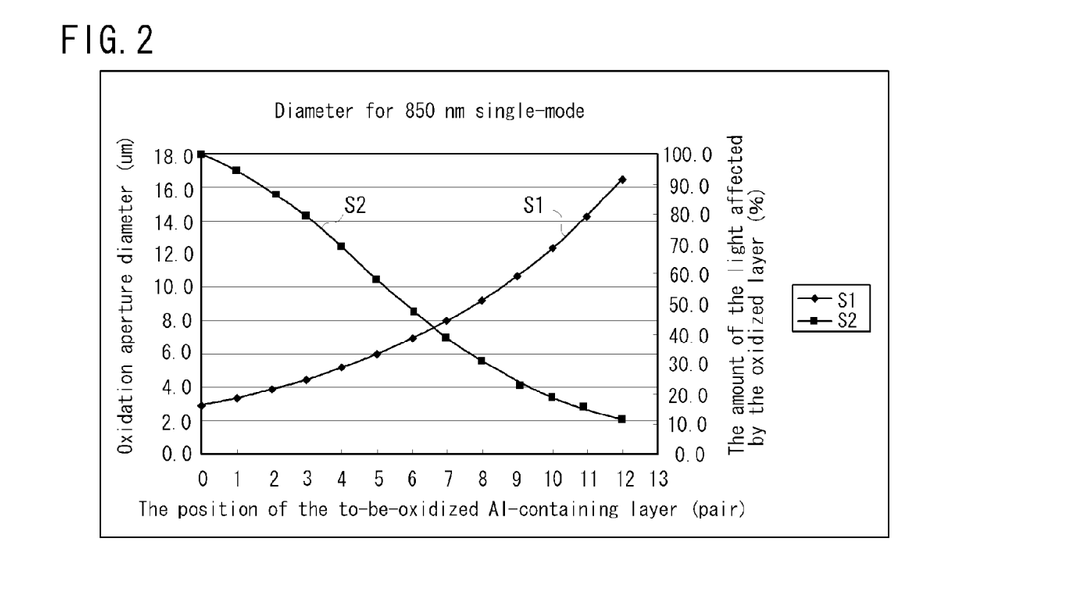
FIG. 2 is a graph illustrating the relation of the position of a to-be-oxidized Al-containing layer and the maximum diameter of the oxidation aperture for obtaining a single-mode, in an example.

A to-be-oxidized Al-containing layer formed in a VCSEL of an example will be now described. FIG. 2 is a graph of theoretical calculation of a VCSEL of 850 nm under a single-mode condition calculated by the equivalent refractive index method. The horizontal axis shows the distance from the active region to the to-be-oxidized Al-containing layer, and the numerals, 0, 1, 2, . . . 13 depict the number of the DBR pairs (one pair is made of a high Al-composition layer and a low Al-composition layer) located between the active region and the to-be-oxidized Al-containing layer. Therefore, pair 0 means that the to-be-oxidized Al-containing layer is formed adjacent to the active region. The vertical axis on the left side shows the maximum diameter (micrometers) of the oxidation aperture for obtaining a single-mode. The vertical axis on the right side shows the amount of the light (%) affected by the oxidized layer (to-be-oxidized Al-containing layer).

The curve S1 shown in FIG. 2 illustrates the relation between the position of the to-be-oxidized Al-containing layer and the oxidation aperture diameter, and the curve S2 illustrates the relation between the position of the to-be-oxidized Al-containing layer and the amount of the light affected by the oxidized layer. From the curve S1, for example, when the to-be-oxidized Al-containing layer is formed adjacent to the active region (the number of the pair is 0), the diameter of the oxidation aperture of the to-be-oxidized Al-containing layer for obtaining a single-mode is three micrometers at maximum. In other words, if the diameter of the oxidation aperture is equal to or less than three micrometers, a single-mode can be obtained; whereas the diameter greater than three micrometers provides a multi-mode. The curve S1 shows that as the position of the to-be-oxidized Al-containing layer is spaced farther from the active region, the maximum diameter of the oxidation aperture for obtaining a single-mode becomes larger.

The curve S2 shows that, when the to-be-oxidized Al-containing layer is formed adjacent to the active region (the number of the pair is 0), the amount of the light affected by the oxidized layer is about 100%. This is because the optical output becomes the largest in the active region. As the to-be-oxidized Al-containing layer is spaced farther from the active region, the amount of the light affected by the oxidized layer gradually decreases.

For the VCSEL of the example, the to-be-oxidized Al-containing layer for current confining and the to-be-oxidized Al-containing layer for light confining may be each individually formed in the vertical resonator of the VCSEL. The oxidized Al-containing layer for light confining of the example may be formed based on theory shown in FIG. 2. The diameter of the oxidation aperture of the to-be-oxidized Al-containing layer may be formed by controlling the oxidation; wherein as the diameter becomes smaller, the more difficult the control of the oxidation becomes, which worsens reproducibility of the oxidation aperture and lowers the productivity. If the diameter of the oxidation aperture can be made larger, the control of oxidation becomes easier, which improves the reproducibility of the oxidation aperture, and improves productivity and also ESD resistance voltage. This is because the ESD resistance voltage is proportional to the diameter or the area of the oxidation aperture.

By placing the to-be-oxidized Al-containing layer for light confining apart from the active region, the function of light confining may be performed; however, the layer does not sufficiently perform the function of current confining. Specifically, positive holes injected from the p-side electrode 28 or electrons injected from the n-side electrode 30 may diffuse horizontally in the upper DBR and the lower DBR. If the to-be-oxidized Al-containing layer is located apart from the active region, these carriers are not confined, and the carriers are not effectively injected into the active region 24; which may provide insufficient coupling efficiency, and increase oscillation threshold or cause heat generation. Therefore, for the VCSEL of this example, the to-be-oxidized Al-containing layer for current confining is formed at a position near the active region, at least nearer the active region than the to-be-oxidized Al-containing layer for light confining.

In addition, in terms of productivity of the VCSEL, it is desirable that the diameter of each of the oxidation aperture of the two to-be-oxidized Al-containing layers be larger than three micrometers, and it is further desirable that same oxidized regions be formed by making the composition and the film thickness of the two to-be-oxidized Al-containing layers same value.

Referring back to FIG. 1, the first to-be-oxidized Al-containing layer 40 is formed at a position relatively spaced apart from the active region 24 in the n-type lower DBR 22. The diameter of the oxidation aperture (the diameter of the non-oxidized region 44) of the first to-be-oxidized Al-containing layer 40 may be formed based on the curve S1, and when formed at a position where the number of the pairs from the active region 24 is 10, for example, the diameter of the oxidation aperture may be a size of about twelve micrometers, the maximum diameter for obtaining a single-mode.

On the other hand, the second to-be-oxidized Al-containing layer 50 is formed relatively near the active region 24 in the p-type upper DBR 26, or between the upper DBR 26 and the active region 24. The diameter of the oxidation aperture (the diameter of the non-oxidized region 54) of the second to-be-oxidized Al-containing layer 50 may be selected as appropriate for current confining. For example, when the second to-be-oxidized Al-containing layer 50 is formed between the upper DBR 26 and the active region 24, the diameter of the oxidation aperture can be made greater than three micrometers, the maximum diameter of the oxidation aperture for obtaining a single-mode; and the diameter may be, for example, twelve micrometers as same as the diameter of the oxidation aperture of the first to-be-oxidized Al-containing layer 40.

Figure 3:
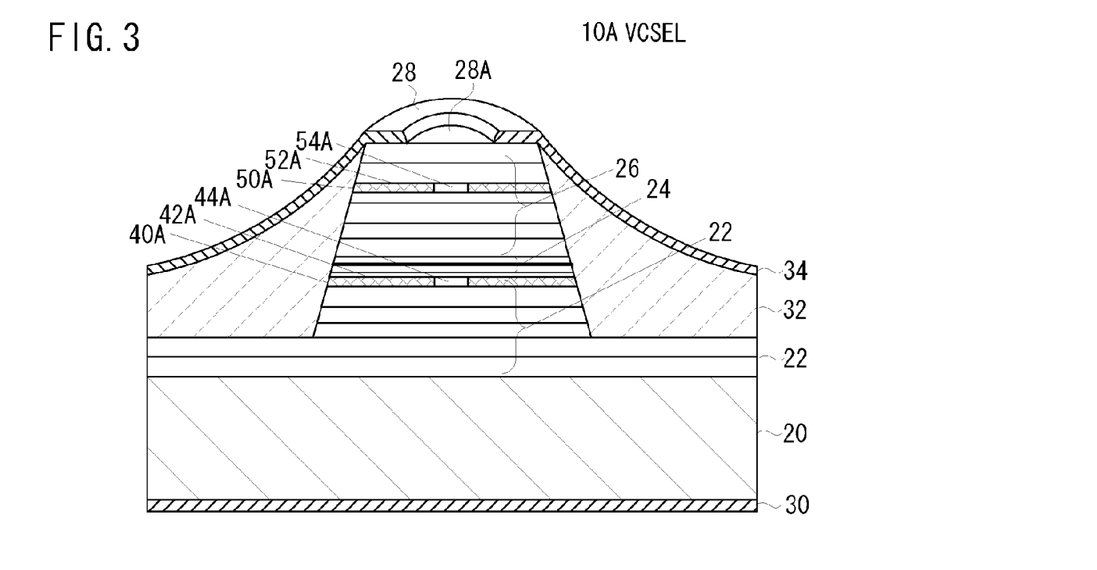
FIG. 3 is a schematic cross sectional view of a VCSEL according to a second example of the present invention.

FIG. 3 illustrates a configuration of a VCSEL of a second example of the present invention. A VCSEL 10A of the second example has a basically similar configuration to that of the VCSEL of the first example; however, the conductivity type of the substrate is opposite to that of the first example. As shown in FIG. 3, the VCSEL 10A may include a p-type GaAs substrate 20, a p-type lower DBR 22, an active region 24, an n-type upper DBR 26, an annular n-side electrode 28 electrically coupled to the upper DBR, and a p-side electrode 30 formed on the back surface of the substrate. Other configurations such as DBRs are similar to those of the first example.

A first and a second to-be-oxidized Al-containing layers 40A and 50A may be made of p-type or n-type AlAs or AlGaAs similarly to the first example, and the film thickness thereof may be about 20 to 30 nm. The first to-be-oxidized Al-containing layer 40A may be formed in the p-type lower DBR 22, or may be formed between the lower DBR 22 and the active region 24, and the layer 40A may perform a current confining function. The first to-be-oxidized Al-containing layer 40A may include an annular oxidized region 42A that reflects the outline of a mesa, and a p-type non-oxidized region (oxidation aperture) 44A surrounded by the oxidized region 42A.

The second to-be-oxidized Al-containing layer 50A may be formed in the n-type upper DBR 26 at a position relatively spaced apart from the active region 24, and may include an annular oxidized region 52A and an n-type non-oxidized region (oxidation aperture) 54A surrounded by the oxidized region 52A. The second to-be-oxidized Al-containing layer 50A may perform a light confining function, and the diameter of the oxidation aperture may be formed based on the curve S1 shown in FIG. 2.

In the second example, the diameter of the oxidation aperture of the second to-be-oxidized Al-containing layer 50A formed in the n-type upper DBR 26 is made larger, and thus the barrier to the mobility of positive holes having a slower mobility than that of electrons can be relieved, which enables to lower resistance of the device.

Figure 4:
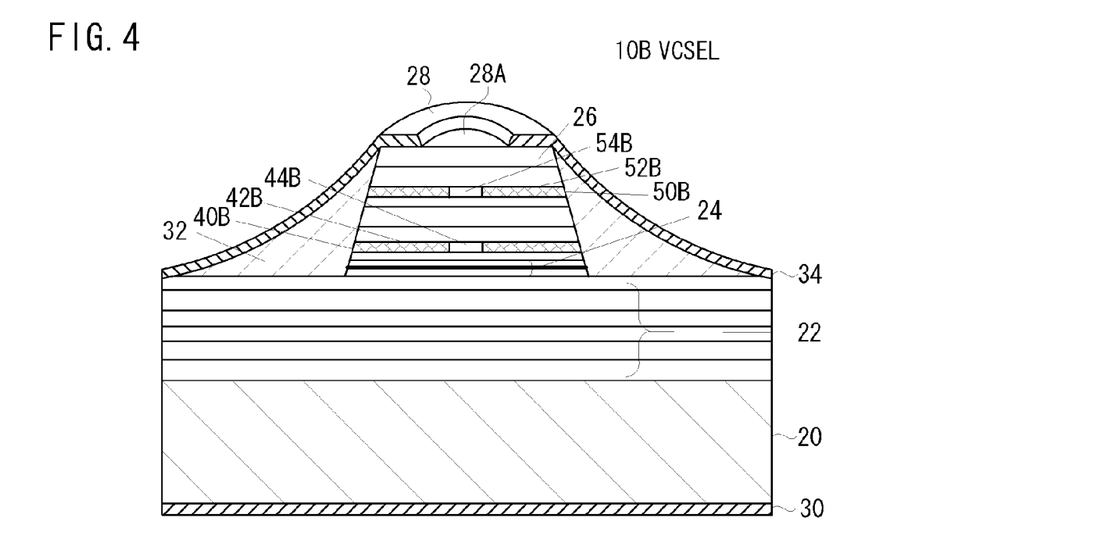
FIG. 4 is a schematic cross sectional view of a VCSEL according to a third example of the present invention.

FIG. 4 illustrates a configuration of a VCSEL according to a third example of the present invention. A VCSEL 10B according to the third example may include, on an n-type GaAs substrate 20, an n-type lower DBR 22, an active region 24, and a p-type upper DBR 26. A first to-be-oxidized Al-containing layer 40B may be formed between the active region 24 and the upper DBR 26 or at a position near the active region 24 in the upper DBR 26, and may perform a current confining function. A second to-be-oxidized Al-containing layer 50B may be formed in the upper DBR 26 spaced farther from the active region 24 than the first to-be-oxidized Al-containing layer 40B, and may perform a light confining function. The first and second to-be-oxidized Al-containing layers 40B and 50B may be made of p-type AlAs or AlGaAs similarly to those of the example described above. In the third example, the first and second to-be-oxidized Al-containing layers 40B and 50B are formed above the active region 24, and therefore, in this case, a mesa structure may be formed at least in the upper DBR. Preferably, the size of a non-oxidized region 54B may be same as or greater than the size of the non-oxidized region 44B. Alternatively, as a modification of the third example, if the GaAs substrate is p-type, a p-type lower DBR 22, an active region 24, and an n-type upper DBR 26 may be formed, and a first and a second to-be-oxidized Al-containing layers may be formed in the lower DBR 22. The first to-be-oxidized Al-containing layer nearer the active region may perform a current confining function, and the second to-be-oxidized Al-containing layer farther from the active region may perform a light confining function. The size of the non-oxidized region 54B may be same as or larger than the size of the non-oxidized region 44B.

Figure 5:
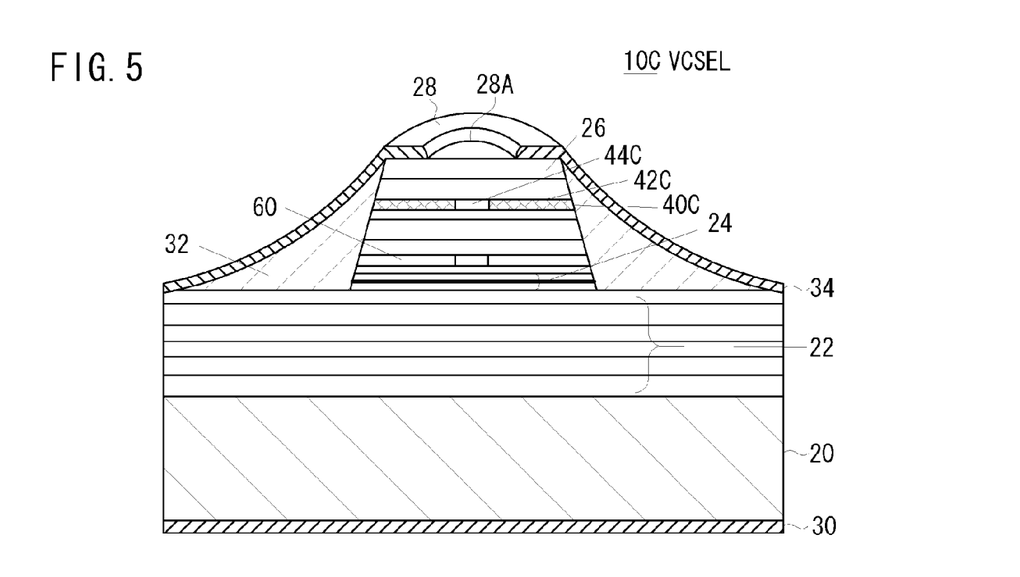
FIG. 5 is a schematic cross sectional view of a VCSEL according to a fourth example of the present invention.

FIG. 5 illustrates a configuration of a VCSEL according to a fourth example of the present invention. A VCSEL 10C according to the fourth example may include, on an n-type GaAs substrate 20, an n-type lower DBR 22, an active region 24, and an n-type upper DBR 26. A tunneling junction region 60 may be formed between the upper DBR 26 and the active region 24 or in the upper DBR 26, and a to-be-oxidized Al-containing layer 40C may be formed at a position spaced farther from the active region than the tunneling junction region 60. The tunneling junction region 60 may perform a current confining function, and the to-be-oxidized Al-containing layer 40C may perform a light confining function.

Figure 6:
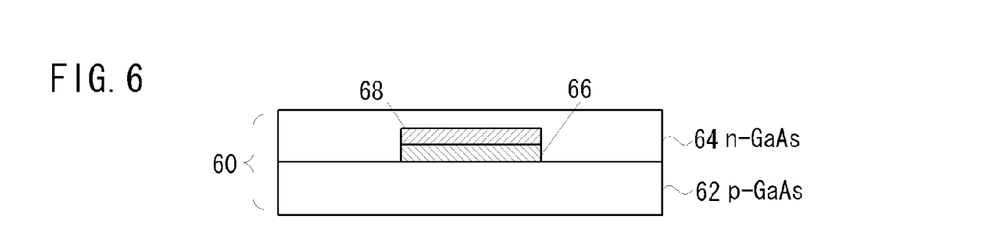
FIG. 6 illustrates a configuration of the tunneling junction region shown in FIG. 5.

As shown in FIG. 6, the tunneling junction region 60 may include a p-type GaAs layer 62, and an n-type GaAs layer 64 thereon. In the n-type GaAs layer 64, a tunneling layer 66 that is joined to the p-type GaAs layer 62 and is made of p+ GaAsSb having a high impurity concentration, and a tunneling layer 68 that is joined to the tunneling layer 66 and is made of n+ InGaAs having a high impurity concentration may be formed. The tunneling layers 66 and 68 allow current to flow only in the tunneling layers 66 and 68 by tunneling effect similarly to the oxidation aperture that performs a current confining function. The tunneling layers 66 and 68 may be formed perpendicularly with respect to the optical axis in a round shape having a certain diameter. The impurity concentration of the tunneling layers 66 and 68 is on the order of 19th to 20th power, and higher than a standard doping level (17th to 18th power) for a DBR.

A method for fabricating the tunneling junction region 60 may include growing the p+ GaAsSb layer and the n+ InGaAs layer on the GaAs layer 62 by crystal growth, and etching the GaAsSb layer and the InGaAs layer to leave a region of the tunneling layers through which tunneling current flows. The layers to be etched are the GaAsSb layer and the InGaAs layer only. After that, the GaAs layer 64 may be formed thereon by using recrystallization growth to create the upper DBR.

In an example, the active layer is made of three quantum well layers of GaInAs having a thickness of 8 nm and an In-composition of 36%, the barrier layer is a GaAs layer having a thickness of 25 nm, and the spacer layers on both sides of the active layer and the barrier layer are i-GaAs layers having a film thickness being same as the oscillation wavelength ($\lambda$) including the active layer and the barrier layer described above. Above them, a p-GaAs layer and an n-GaAs layer each having a film thickness of $\frac{1}{4}\lambda$ are formed, and on the interface of the p-GaAs layer and the n-GaAs layer, an n+ In0.16GaAs layer and a p+ GaAsSb$_{0.12}$ layer (tunneling layers) are formed as shown in FIG. 6. The film thicknesses of the tunneling layers 66 and 68 are 12.5 nm and 9.5 nm respectively, and the diameter of the tunneling layers is 5 to 12 micrometers. Above them, 20 pairs of n-type Al$_{0.8}$GaAs and GaAs DBR may be formed, and 35 pairs of n-type Al$_{0.8}$GaAs and GaAs DBR may be formed between the substrate and the spacer layer below the active layer. In the upper DBR, the oxidized confining layer is formed, and the confining diameter thereof is 5 to 12 um. The structure of this example is applicable to a VCSEL having a wavelength of 1.2 micrometers band.

Figure 7:
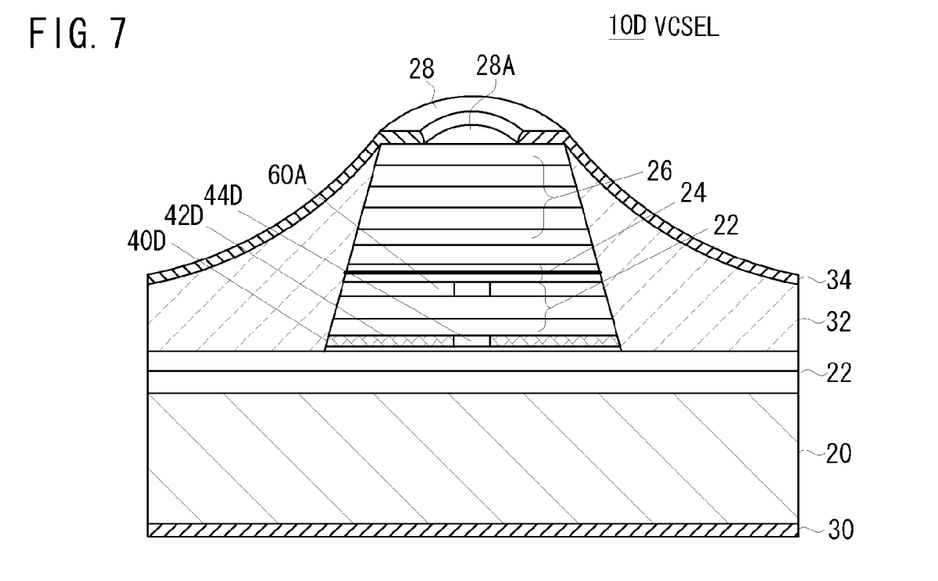
FIG. 7 is a schematic cross sectional view of a VCSEL according to a fifth example of the present invention.

FIG. 7 illustrates a configuration of a VCSEL according to a fifth example of the present invention. A VCSEL 10D of the fifth example is a modification of the VCSEL of the fourth example, and a tunneling junction region 60A and a to-be-oxidized Al-containing layer 40D may be formed on the side of the lower DBR 22. Specifically, the VCSEL 10D may include an n-type GaAs substrate, an n-type lower DBR 22, an active region 24, and an n-type upper DBR 26. The tunneling junction region 60A may be formed between the lower DBR 22 and the active region 24 or in the lower DBR 22, and may perform a current confining function. The to-be-oxidized Al-containing layer 40D may be formed in a position spaced farther from the active region 24 than the tunneling junction region 60A, and may perform a light confining function.

Figure 8:
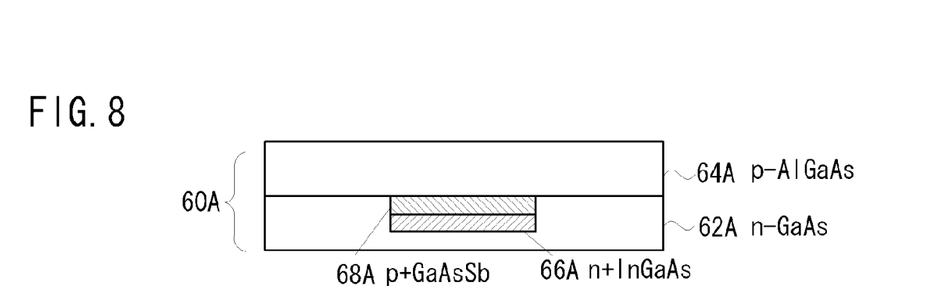
FIG. 8 illustrates a configuration of the tunneling junction region shown in FIG. 7.

As shown in FIG. 8, the tunneling junction region 60A may include an n-type GaAs layer 62A, and a p-type AlGaAs layer 64A formed thereon. In the n-type GaAs layer 62A, a tunneling layer 66A made of n+ InGaAs is formed, and a tunneling layer 68A made of p+ GaAsSb is formed thereon. Each of the tunneling layers 66A and 68A has a confining diameter on the optical axis that coincides with an oxidation aperture 44D of the to-be-oxidized Al-containing layer 40D.

Figure 9:
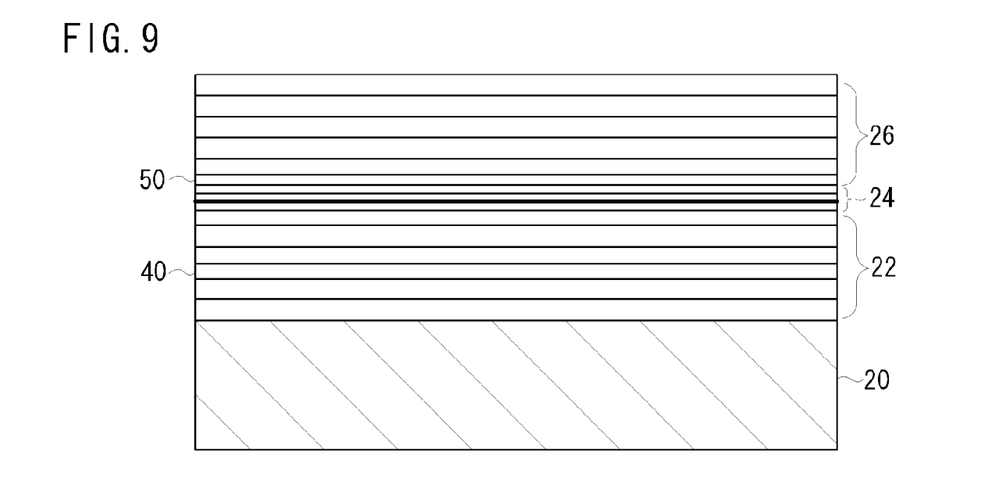
FIG. 9 is a cross sectional view illustrating a process for fabricating a VCSEL according to the first example.

A method for fabricating a VCSEL according to the first example of the present invention will be now described. As shown in FIG. 9, by Metal Organic Chemical Vapor Deposition (MOCVD), on the n-type GaAs substrate 20, an n-type GaAs buffer layer having a carrier concentration of $2\times10^{18}$ cm$^{-3}$ and a thickness of about 0.2 micrometers is deposited. On the buffer layer, 37.5 periods of Al$_{0.9}$Ga$_{0.1}$As and Al$_{0.12}$Ga$_{0.88}$As, each having a thickness of $\frac{1}{4}$ of the wavelength in the medium, are alternately stacked to form the n-type lower DBR 22. Stacked on the lower DBR 22 is the active region 24 made of an undoped lower Al$_{0.6}$Ga$_{0.4}$As spacer layer, an undoped quantum well active layer (made of three GaAs quantum well layers each having a thickness of 70 nm and four Al$_{0.3}$Ga$_{0.7}$As barrier layers each having a thickness of 50 nm), and an undoped upper Al$_{0.6}$Ga$_{0.4}$As spacer layer. Stacked on the active region 24 is the p-type upper DBR 26 made by stacking 26 periods of p-type Al$_{0.9}$Ga$_{0.1}$As and Al$_{0.12}$Ga$_{0.88}$As having a carrier concentration of $2\times10^{18}$ cm$^{-3}$ such that the thickness of each layer becomes $\frac{1}{4}$ of the wavelength in the medium. In addition, at a predetermined position in the lower DBR 22, an n-type AlAs layer having a film thickness of 20 nm is formed as the first to-be-oxidized Al-containing layer 40, and at a predetermined position in the upper DBR 26, a p-type AlAs layer having a film thickness of 20 nm is formed as the second to-be-oxidized Al-containing layer 50. For the uppermost layer of the upper DBR 26, a p-type GaAs contact layer 114 having a carrier concentration of $1\times10^{19}$ cm$^{-3}$ and a film thickness of about 20 nm is formed.

Figure 10:
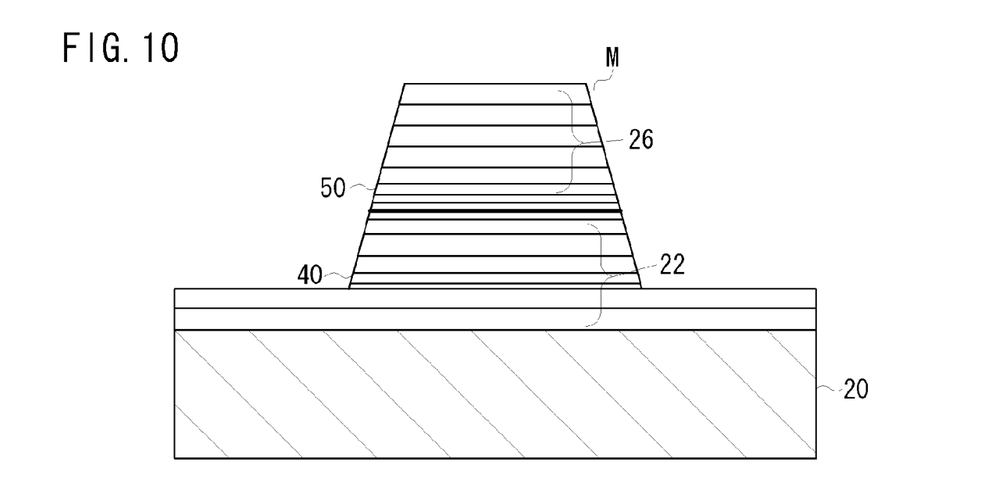
FIG. 10 is a cross sectional view illustrating a process for fabricating a VCSEL according to the first example.

Next, by using a photolithography process, a resist mask is formed on the crystal growth layers. Then, a reactive ion etching is performed by using boron trichloride as an etching gas to form an annular groove or trench to a middle portion of the lower DBR 22. By this process, as shown in FIG. 10, a conical mesa structure M may be formed. At this time, the side surfaces of the first and second to-be-oxidized Al-containing layers 40 and 50 are exposed by the mesa structure M. A tapered shape formed on the side surface of the mesa structure can be obtained by selectively changing etching conditions.

Figure 11:
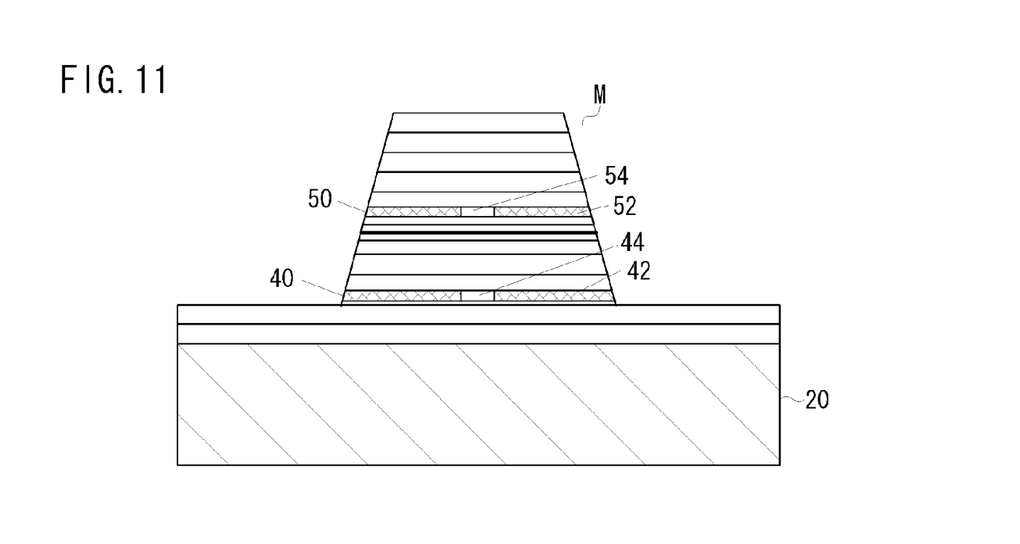
FIG. 11 is a cross sectional view illustrating a process for fabricating a VCSEL according to the first example.

Then, the substrate is exposed to a vapor atmosphere at 340 degrees Celsius, for example, for a certain amount of time to perform an oxidation process. The first and second to-be-oxidized Al-containing layers 40 and 50 are AlAs layers having a same film thickness and composition, and the Al-composition is higher than the Al-composition of the lower DBR and upper DBR, and thus the oxidation speed thereof is significantly high. Therefore, in the first and second to-be-oxidized Al-containing layers 40 and 50, a same oxidation proceeds from a side surface of the mesa toward inside thereof; thereby oxidized regions 42 and 52 that reflect the shape of the mesa, and non-oxidized regions 44 and 54 surrounded by the oxidized regions 42 and 52 are formed, in the first and second to-be-oxidized Al-containing layers 40 and 50. Because the mesa structure M has a conical shape, the diameter of the non-oxidized region 44 becomes larger than the diameter of the non-oxidized region 54. FIG. 11 illustrates a status after the oxidation process.

Next, by using a plasma CVD apparatus, an interlayer insulating film made of SiN or the like is deposited on the entire surface of the substrate including the mesa structure M. After that, the interlayer insulating film is etched by using a general photolithography process to remove the interlayer insulating film at a top portion of the mesa structure M, and to expose the contact layer of the upper DBR 26, and then the p-side electrode 28 is patterned on the upper DBR 26. On the back surface of the substrate, the n-side electrode 30 is formed. As such the VCSEL 10 shown in FIG. 1 may be formed.

Figure 12:
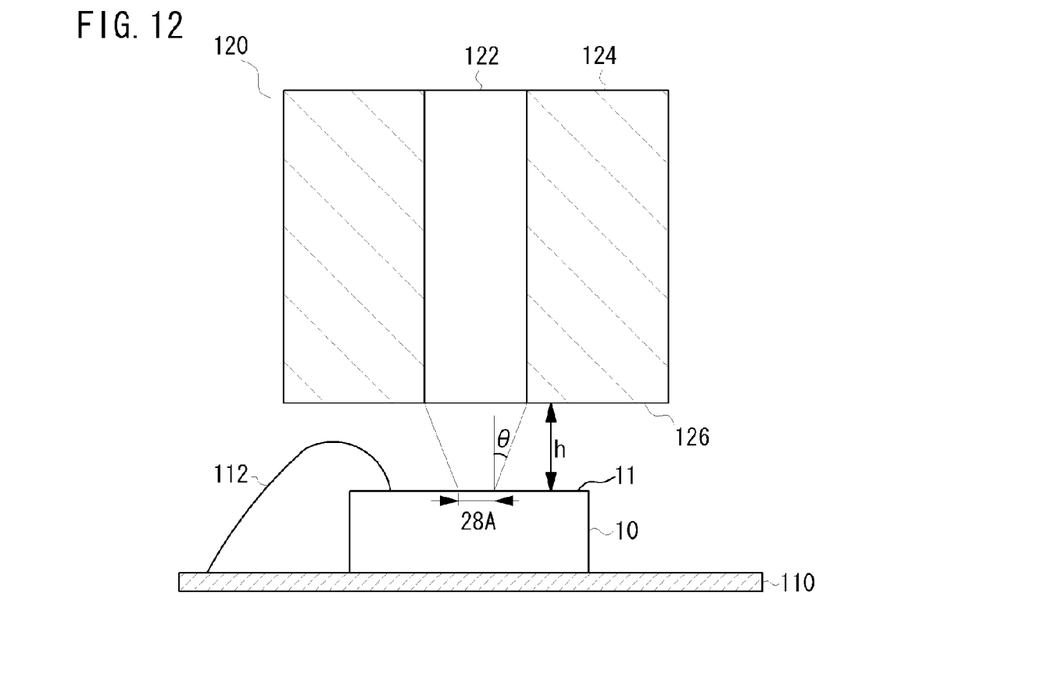
FIG. 12 illustrates a configuration of a semiconductor module to which a VCSEL of an example is applied.

A semiconductor module to which a VCSEL of an example is applied will be now described. FIG. 12 illustrates a schematic configuration of a semiconductor module of this example. A semiconductor module 100 may include the VCSEL 10 mounted on a circuit board 110, and an optical fiber 120 that transmits the light emitted from the VCSEL. The semiconductor module may be used as an optical transmission apparatus that transmits an optical signal from the VCSEL. On a surface of the circuit board 110, plural metal wirings (not shown) may be formed, and the n-side electrode 30 of the VCSEL 10 may be coupled to a corresponding metal wiring. The metal wiring 34 coupled to the p-side electrode 28 may be coupled to an electrode pad (not shown), and the electrode pad may be coupled to a corresponding metal wiring by the bonding wire 112. The VCSEL 10 emits laser light from the opening 28A of the p-side electrode 28 being an emission surface 11, when driven into forward bias.

The optical fiber 120 may include a core 122 and a clad 124, and a incidence surface 126 may be disposed to face the emission surface 11 of the VCSEL 10. The center of the core 122 is positioned to match the optical axis of the VCSEL 10, that is, the center of the opening 28A.

If the opening diameter of the opening 28A of the VCSEL 10 is D, the distance from the emission surface 11 of the VCSEL to the incidence surface 126 of the optical fiber is h, the maximum divergence angle of the laser light from the VCSEL is 2θ, and the diameter of the core of the optical fiber is d, then the relation as follows is obtained:

$$d > D + (2 \times h \times \tan \theta).$$

In the VCSEL of this example, the to-be-oxidized Al-containing layer for light confining may be formed spaced apart from the active region, and the diameter of the oxidation aperture becomes larger (see FIG. 2), therefore the opening diameter D of the opening 28A of the p-side electrode becomes larger than the diameter of the oxidation aperture. The single-mode laser light beam thus obtained may have a large spot diameter and a small divergence angle.

While exemplary embodiments of the present invention have been described in detail, the invention is not limited to these specific embodiments, and various modifications and changes can be made without departing from the inventive scope that is defined by the following claims.

What is claimed is:

1. A vertical-cavity surface-emitting laser diode (VCSEL) comprising:
   a first semiconductor multilayer film reflective mirror of a first conductivity type that includes a stacked structure of a high-Al refractive index layer having a high Al-composition and a low-Al refractive index layer having a lower Al-composition than the high-Al refractive index layer, an active region that includes a light emitting layer, and a second semiconductor multilayer film reflective mirror of a second conductivity type that includes a stacked structure of a high-Al refractive index layer having a high Al-composition and a low-Al refractive index layer having a lower Al-composition than the high-Al refractive index layer, on a substrate;
   a mesa structure or a trench structure being formed from the second semiconductor multilayer film reflective mirror to at least a portion of the first semiconductor multilayer film reflective mirror;
   a first to-be-oxidized Al-containing layer being formed in the first semiconductor multilayer film reflective mirror and having a higher Al-composition than the high-Al refractive index layer of the first semiconductor multilayer film reflective mirror; and
   a second to-be-oxidized Al-containing layer being formed in the second semiconductor multilayer film reflective mirror or between the active region and the second semiconductor multilayer film reflective mirror, and having a higher Al-composition than the high-Al refractive index layer of the second semiconductor multilayer film reflective mirror,
   the first to-be-oxidized Al-containing layer being formed farther from the active region than the second to-be-oxidized Al-containing layer;
   the first to-be-oxidized Al-containing layer having a first oxidized region oxidized from a side surface of the mesa or trench structure, and a first non-oxidized region surrounded by the first oxidized region;
   the second to-be-oxidized Al-containing layer having a second oxidized region oxidized from a side surface of the mesa or trench structure, and a second non-oxidized region surrounded by the second oxidized region,
   the size of the first non-oxidized region being larger than the maximum size of the second non-oxidized region that provides a single mode oscillation, and smaller than the maximum size of the first non-oxidized region that provides a single mode oscillation,
   the size of the second non-oxidized region being larger than the maximum size of the second non-oxidized region that provides a single mode oscillation, and
   the size of the first non-oxidized region being equal to or larger than the size of the second non-oxidized region.

2. The VCSEL according to claim 1, wherein the first conductivity type is n-type, and the second conductivity type is p-type.

3. A vertical-cavity surface-emitting laser diode (VCSEL) comprising:
   a first semiconductor multilayer film reflective mirror of a first conductivity type that includes a stacked structure of a high-Al refractive index layer having a high Al-composition and a low-Al refractive index layer having a lower Al-composition than the high-Al refractive index layer, an active region that includes a light emitting layer, and a second semiconductor multilayer film reflective mirror of a second conductivity type that includes a stacked structure of a high-Al refractive index layer having a high Al-composition and a low-Al refractive index layer having a lower Al-composition than the high-Al refractive index layer, on a substrate;
   a mesa structure or a trench structure being formed from the second semiconductor multilayer film reflective mirror to at least a portion of the first semiconductor multilayer film reflective mirror;
   a first to-be-oxidized Al-containing layer being formed in the first semiconductor multilayer film reflective mirror or between the active region and the first semiconductor multilayer film reflective mirror, and having a higher Al-composition than the high-Al refractive index layer of the first semiconductor multilayer film reflective mirror; and
   a second to-be-oxidized Al-containing layer being formed in the second semiconductor multilayer film reflective mirror and having a higher Al-composition than the high-Al refractive index layer of the second semiconductor multilayer film reflective mirror, the second to-be-oxidized Al-containing layer being formed farther from the active region than the first to-be-oxidized Al-containing layer, the first to-be-oxidized Al-containing layer having a first oxidized region oxidized from a side surface of the mesa or trench structure, and a first non-oxidized region surrounded by the first oxidized region, the second to-be-oxidized Al-containing layer having a second oxidized region oxidized from a side surface of the mesa or trench structure, and a second non-oxidized region surrounded by the second oxidized region, the size of the first non-oxidized region being larger than the maximum size of the first non-oxidized region that provides a single mode oscillation, the size of the second non-oxidized region being larger than the maximum size of the first non-oxidized region that provides a single mode oscillation, and smaller than the maximum size of the second non-oxidized region that provides a single mode oscillation, and the size of the second non-oxidized region being equal to or larger than the size of the first non-oxidized region.

4. The VCSEL according to claim 3, wherein the first conductivity type is p-type, and the second conductivity type is n-type.

5. A vertical-cavity surface-emitting laser diode (VCSEL) comprising:
   a first semiconductor multilayer film reflective mirror of a first conductivity type that includes a stacked structure of a high-Al refractive index layer having a high Al-composition and a low-Al refractive index layer having a lower Al-composition than the high-Al refractive index layer, an active region that includes a light emitting layer, and a second semiconductor multilayer film reflective mirror of a second conductivity type that includes a stacked structure of a high-Al refractive index layer having a high Al-composition and a low-Al refractive index layer having a lower Al-composition than the high-Al refractive index layer, on a substrate;
   a mesa structure or a trench structure being formed at least in the second semiconductor multilayer film reflective mirror; and
   a first and a second to-be-oxidized Al-containing layers being formed in the second semiconductor multilayer film reflective mirror or between the active region and the second semiconductor multilayer film reflective mirror, and having a higher Al-composition than the high-Al refractive index layer of the second semiconductor multilayer film reflective mirror,
   the first to-be-oxidized Al-containing layer being formed farther from the active region than the second to-be-oxidized Al-containing layer,
   the first to-be-oxidized Al-containing layer having a first oxidized region oxidized from a side surface the mesa or trench structure, and a first non-oxidized region surrounded by the first oxidized region,
   the second to-be-oxidized Al-containing layer having a second oxidized region oxidized from a side surface of the mesa or trench structure, and a second non-oxidized region surrounded by the second oxidized region,
   the size of the first non-oxidized region being larger than the maximum size of the second non-oxidized region that provides a single mode oscillation, and smaller than the maximum size of the first non-oxidized region that provides a single mode oscillation, and
   the size of the second non-oxidized region being larger the maximum size of the second non-oxidized region that provides a single mode oscillation.

6. The VCSEL according to claim 5, wherein the first conductivity type is n-type, and the second conductivity type is p-type.

7. A vertical-cavity surface-emitting laser diode (VCSEL) comprising:
   a first semiconductor multilayer film reflective mirror of a first conductivity type that includes a stacked structure of a high-Al refractive index layer having a high Al-composition and a low-Al refractive index layer having a lower Al-composition than the high-Al refractive index layer, an active region that includes a light emitting layer, and a second semiconductor multilayer film reflective mirror of a second conductivity type that includes a stacked structure of a high-Al refractive index layer having a high Al-composition and a low-Al refractive index layer having a lower Al-composition than the high-Al refractive index layer, on a substrate;
   a mesa structure or a trench structure being formed from the second semiconductor multilayer film reflective mirror to at least a portion of the first semiconductor multilayer film reflective mirror; and
   a first and a second to-be-oxidized Al-containing layers being formed in the first semiconductor multilayer film reflective mirror or between the active region and the first semiconductor multilayer film reflective mirror, and having a higher Al-composition than the high-Al refractive index layer of the first semiconductor multilayer film reflective mirror,
   the second to-be-oxidized Al-containing layer being formed farther from the active region than the first to-be-oxidized Al-containing layer,
   the first to-be-oxidized Al-containing layer having a first oxidized region oxidized from a side surface the mesa or trench structure, and a first non-oxidized region surrounded by the first oxidized region,
   the second to-be-oxidized Al-containing layer having a second oxidized region oxidized from a side surface the mesa or trench structure, and a second non-oxidized region surrounded by the second oxidized region,
   the size of the first non-oxidized region being larger than the maximum size of the first non-oxidized region that provides a single mode oscillation, and
   the size of the second non-oxidized region being larger than the maximum size of the first non-oxidized region that provides a single mode oscillation, and smaller than the maximum size of the second non-oxidized region that provides a single mode oscillation.

8. The VCSEL according to claim 7, wherein the first conductivity type is p-type, and the second conductivity type is n-type.

9. A vertical-cavity surface-emitting laser diode (VCSEL) comprising:
   a first semiconductor multilayer film reflective mirror of a first conductivity type that includes a stacked structure of a high-Al refractive index layer having a high Al-composition and a low-Al refractive index layer having a lower Al-composition than the high-Al refractive index layer, an active region that includes a light emitting layer, and a second semiconductor multilayer film reflective mirror of a first conductivity type that includes a stacked structure of a high-Al refractive index layer having a high Al-composition and a low-Al refractive index layer having a lower Al-composition than the high-Al refractive index layer, on a substrate;
   a mesa structure or a trench structure being formed from the second semiconductor multilayer film reflective mirror to at least a portion of the first semiconductor multilayer film reflective mirror; and a to-be-oxidized Al-containing layers being formed in the first semiconductor multilayer film reflective mirror and having a higher Al-composition than the high-Al refractive index layer of the first semiconductor multilayer film reflective mirror; and a tunneling junction region being formed in the first semiconductor multilayer film reflective mirror or between the active region and the first semiconductor multilayer film reflective mirror, the to-be-oxidized Al-containing layer being formed farther from the active region than the tunneling junction region, the to-be-oxidized Al-containing layer having an oxidized region oxidized from a side surface the mesa or trench structure, and a non-oxidized region surrounded by the oxidized region, and the size of the non-oxidized region being smaller than the maximum size of the non-oxidized region that provides a single mode oscillation.

10. A vertical-cavity surface-emitting laser diode (VCSEL) comprising:
   a first semiconductor multilayer film reflective mirror of a first conductivity type that includes a stacked structure of a high-Al refractive index layer having a high Al-composition and a low-Al refractive index layer having a lower Al-composition than the high-Al refractive index layer, an active region that includes a light emitting layer, and a second semiconductor multilayer film reflective mirror of a first conductivity type that includes a stacked structure of a high-Al refractive index layer having a high Al-composition and a low-Al refractive index layer having a lower Al-composition than the high-Al refractive index layer, on a substrate;
   a mesa structure or a trench structure being formed at least in the second semiconductor multilayer film reflective mirror;
   a to-be-oxidized Al-containing layer being formed in the second semiconductor multilayer film reflective mirror and having a higher Al-composition than the high-Al refractive index layer of the second semiconductor multilayer film reflective mirror; and
   a tunneling junction region being formed in the second semiconductor multilayer film reflective mirror or between the active region and the second semiconductor multilayer film reflective mirror,
   the to-be-oxidized Al-containing layer being formed farther from the active region than the tunneling junction region,
   the to-be-oxidized Al-containing layer having an oxidized region oxidized from a side surface of the mesa or trench structure, and a non-oxidized region surrounded by the oxidized region, and
   the size of the non-oxidized region being smaller than the maximum size of the non-oxidized region that provides a single mode oscillation.

11. The VCSEL according to claim 9, wherein the first conductivity type is n-type, and the tunneling junction region comprises an n-type tunneling layer having a high impurity concentration, and a p-type tunneling layer having a high impurity concentration.

12. A method for fabricating a vertical-cavity surface-emitting laser diode (VCSEL) comprising:
   forming, on a substrate, a first semiconductor multilayer film reflective mirror of a first conductivity type that includes a stacked structure of a high-Al refractive index layer having a high Al-composition and a low-Al refractive index layer having a lower Al-composition than the high-Al refractive index layer, an active region, and a second semiconductor multilayer film reflective mirror of a second conductivity type that includes a stacked structure of a high-Al refractive index layer having a high Al-composition and a low-Al refractive index layer having a lower Al-composition than the high-Al refractive index layer, and forming a first and a second to-be-oxidized Al-containing layers having a higher Al-composition than the high-Al refractive index layer of the first and second semiconductor multilayer film reflective mirrors and having a same film thickness and composition such that the first to-be-oxidized Al-containing layer being formed farther from the active region than the second Al-containing layer;
   forming a mesa structure or a trench structure on the substrate such that at least the side surfaces of the first and second to-be-oxidized Al-containing layers are exposed; and
   oxidizing the first and second to-be-oxidized Al-containing layers from a side surface of the mesa or trench structure and forming a first and a second non-oxidized regions in the first and second to-be-oxidized Al-containing layers,
   the size of the second non-oxidized region being larger than the maximum size of the second non-oxidized region that provides a single mode oscillation,
   the size of the first non-oxidized region being larger than the maximum size of the second non-oxidized region that provides a single mode oscillation, and smaller than the maximum size of the first non-oxidized region that provides a single mode oscillation, and
   the size of the first non-oxidized region being equal or larger than the size of the second non-oxidized region.

13. An optical transmission apparatus comprising: the VCSEL according to claim 1, a coupling material that is electrically coupled to an electrode formed on an emission surface of the VCSEL, and an optical fiber that has an incidence surface opposing to the emission surface of the VCSEL and transmits light emitted from the incidence surface, wherein
   if the opening diameter of the emission surface of the VCSEL is D, the distance between the emission surface of the VCSEL and the incidence surface of the optical fiber is h, the maximum divergence angle of the light emitted from the VCSEL is $2\theta$, and the core diameter of the optical fiber is d, then the relation as follows is obtained,
   $$d > D + (2 \times h \times \tan \theta).$$

* * * * *